United States Patent [19]

Nishizawa et al.

[11] Patent Number: 4,471,228
[45] Date of Patent: Sep. 11, 1984

[54] SOLID-STATE IMAGE SENSOR WITH EXPOSURE CONTROLLER

[75] Inventors: Jun-ichi Nishizawa, Sendai; Masahiro Konishi, Minami-ashigara, both of Japan

[73] Assignee: Fuji Photo Film Co., Ltd., Japan

[21] Appl. No.: 326,884

[22] Filed: Dec. 2, 1981

[30] Foreign Application Priority Data

Dec. 5, 1980 [JP] Japan .............................. 55-171900

[51] Int. Cl.³ .......................................... H01J 40/14
[52] U.S. Cl. .................................. 250/578; 250/211 J
[58] Field of Search ............... 250/211 R, 211 J, 578; 357/29, 30, 31, 32, 24 LR; 358/212, 213

[56] References Cited

U.S. PATENT DOCUMENTS

| | | | |
|---|---|---|---|
| 3,934,161 | 1/1976 | Caywood | 358/213 |
| 3,944,816 | 3/1976 | Harada | 250/211 J |
| 4,338,514 | 7/1982 | Bixby | 250/578 |
| 4,340,819 | 7/1982 | Ogasawara | 250/578 |

Primary Examiner—David C. Nelms
Attorney, Agent, or Firm—McGlew and Tuttle

[57] ABSTRACT

A solid-state image sensor which detects the quantity of light incident on image sensor cells during exposure and performs exposure control in accordance with an exposure value thus obtained. The solid-state image sensor is provided with a photoelectric converter having a plurality of non-destructive readout type image sensor cells arranged in a matrix form; an exposure detector for reading out stored information of predetermined ones of the image sensor cells during exposure, obtaining an added value of the stored information thus read out and detecting that the added value reaches a predetermined level; an exposure controller which is supplied with the detected signal from the exposure detector to control at least one of the charge storage time of each image sensor cell by an optical signal, the intensity of light incident on the image sensor cell and the photosensitivity of the image sensor cell; and a scanner for scanning the photoelectric converter to read out stored information of the image sensor cells during exposure.

5 Claims, 12 Drawing Figures

OPTICAL INPUT

COLOR BALANCE MEASURING CIRCUIT

SOLID-STATE IMAGE SENSOR WITH EXPOSURE CONTROLLER

BACKGROUND OF THE INVENTION

1. Field of the Invention

The present invention relates to a solid-state image sensor, and more particularly to a solid-state image sensor which is capable of performing exposure control in accordance with the quantity of light incident on image sensor cells while detecting it during exposure.

2. Description of the Prior Art

In conventional types of cameras employing a silver salt photographic material it is impossible to control exposure in accordance with the quantity of light incident on a photosensitive material. Accordingly, it is general practice to perform exposure by changing at least one of the lens aperture (the intensity of light incident on the photosensitive material) and the shutter speed (the exposure time of the photosensitive material) by a signal based on the quantity of light incident on a sensor provided separately of the photosensitive material. The same is true of known solid-state image sensors employing optoelectro transducers such as CCDs, BBDs and so forth. That is, the prior art solid-state image sensors are incapable of exposure control such as control of the lens aperture and the exposure time in accordance with the quantity of light incident on their optoelectro transducer unit, and hence they have the defect of difficulty in accurate exposure control.

SUMMARY OF THE INVENTION

It is therefore an object of the present invention to provide a solid-state image sensor which is capable of performing exposure control in accordance with the quantity of light incident on image sensor cells.

Another object of the present invention is to provide a solid-state image sensor which is capable of accurate exposure control.

Yet another object of the present invention is to provide a solid-state image sensor which is designed so that the exposure detection on an image plane can be weighted.

The above objective is achieved by the use of a semiconductor image sensor of a novel construction, already proposed by the present inventors, which permits non-destructive readout and random access and in which image information can be read out from image sensor cells repeatedly.

Briefly stated, the solid-state image sensor of the present invention is provided with a photoelectric converter or optoelectro transducer unit having a plurality of non-destructive readout type image sensor cells arranged in a predetermined form. Stored information of each image sensor cell of the photoelectric converter is read out during exposure and checked by an exposure detector as to whether a proper exposure level has been reached or not. An exposure control mechanism is provided for controlling at least one of the charge storage time of each image sensor cell by an optical signal, the intensity of light incident on the image sensor cell and the photosensitivity of the image sensor cell. The exposure is discontinued at a proper exposure level and image information of the image sensor cell after completion of exposure is read out by a scanner.

DESCRIPTION OF THE PREFERRED EMBODIMENTS

Figure 1:
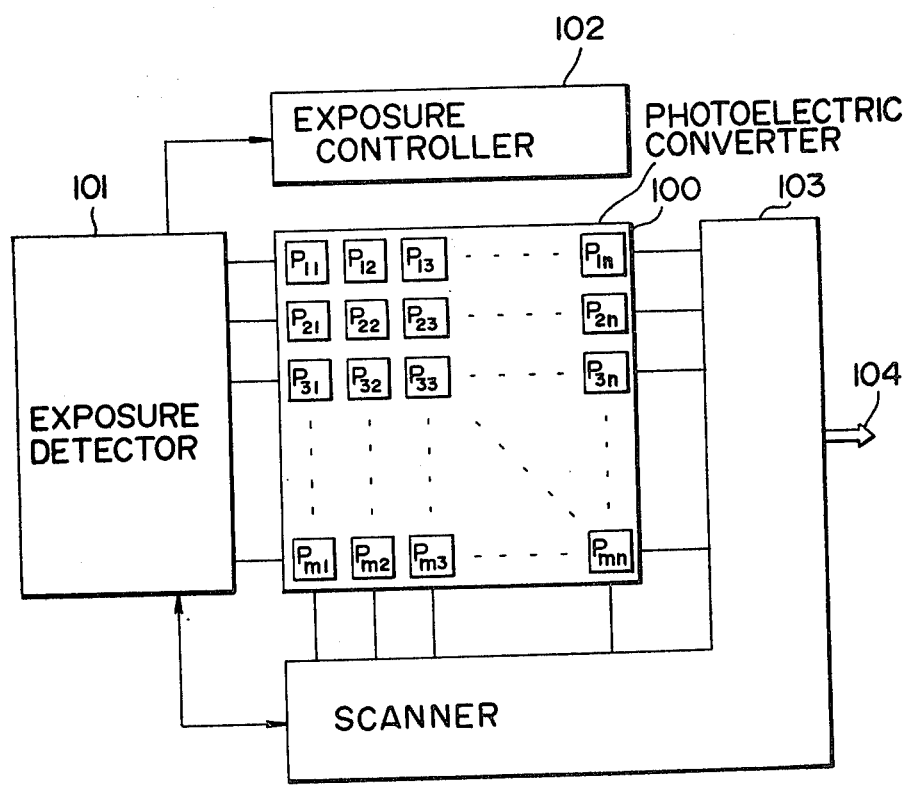
FIG. 1 is a block diagram showing the basic arrangement of the present invention.

FIG. 1 illustrates in block form the basic arrangement of the two-dimensional solid-state image sensor. In FIG. 1, reference numeral 100 indicates a photoelectric converter or optoelectro transducer unit; $P_{11}$ to $P_{mn}$ designates non-destructive readout type image sensor cells; 101 identifies an exposure detector; 102 denotes an exposure controller; 103 represents a scanner; and 104 shows a video output.

As shown in FIG. 1, the two-dimensional solid-state image sensor of the present invention has, as its basic components, the photoelectric converter 100 having the non-destructive readout type image sensor cells $P_{11}$ to $P_{mn}$ arranged in a matrix form; the exposure detector 101 for reading out stored information from a plurality of predetermined image sensor cells of the photoelectric converter 100 during exposure and adding together the read-out information to detect that the added value has reached a predetermined level; the exposure controller 102 which is supplied with the detected signal from the exposure detector to control an exposure parameter this comprises at least one of the charge storage time of each image sensor cell by an optical signal, the intensity of light incident on the image sensor cell, and the photosensitivity of the image sensor cell; and the scanner for scanning the photoelectric converter 100 after completion of exposure to read out the image information of each image sensor cell.

The photoelectric converter 100 is formed by the nondestructive readout type image sensor cells, so that its contents are retained even if information of a plurality of predetermined image sensor cells is read out and, in addition, an optical information storage operation is not interrupted by the readout. Therefore, even if information of predetermined image sensor cells is read out, there is no hindrance in the readout of a video signal after exposure. Accordingly, exposure control can be achieved based on the quantity of light incident on the image sensor cells during exposure, permitting accurate exposure control. It is also possible to employ, as the photoelectric converter, a one-dimensional sensor having image sensor cells arranged in a line.

Figure 2:
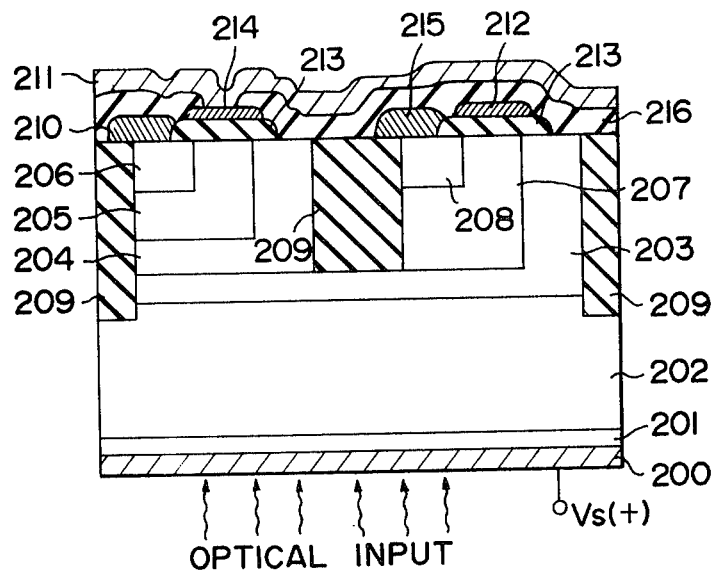
FIG. 2 is a sectional view illustrating an example of a non-destructive readout type image sensor cell for use in the present invention.
Figure 3:
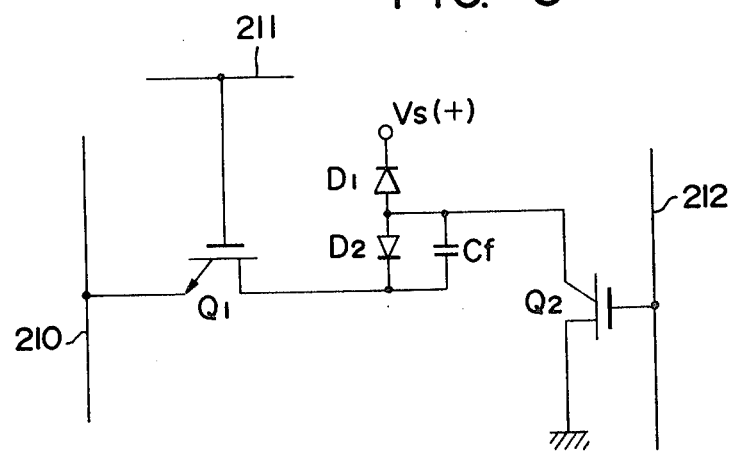
FIG. 3 is its equivalent circuit refresentation.

FIG. 2 illustrates in section an example of the nondestructive readout type picture element cell for use in the present invention and FIG. 3 shows its equivalent circuit. In FIGS. 2 and 3, reference numeral 200 indicates a transparent electrode biased to a power source voltage Vs(+); 201 designates an n+ region; 202 identifies a high resistivity region, for example, a p− region; 203 denotes a p+ region; 204 represents an n+ region; 2-5 shows a p region (a channel region); 2-6 refers to an n+ source region; 207 indicates an n region (a channel region); 208 designates a p+ source region; 209 identifies an isolation region formed of an insulator; 210 denotes a bit line; 211 represents a word line; 212 shows an erase line; 213 refers to a gate insulating film; 214 indicates a gate electrode; 215 designates a grounding electrode; 216 identifies an insulating layer; $Q_1$ denotes a readout transistor; $Q_2$ represents an erasing transistor; $D_1$ and $D_2$ show diodes, and Cf refers to a capacitance. The n+ region 201, the p− region 202, the p+ region 203 and the $n^{30}$ region 204 form a hook structure. This hook structure is equivalently represented by a back-to-back connection of the diodes $D_1$ and $D_2$. The junction capacitance between the p+ region 203 and the n+ region 204 is represented by Cf. The n+ region 204, the p region 205 and the n+ region 206 correspond to the drain, gate and source of the readout transistor $Q_1$, respectively, and the p+ region 203, the n region 207 and the p+ region 208 correspond to the drain, gate and source of the erasing transistor $Q_2$, respectively.

Upon application of an optical input to the picture element cell in such a state in which the predetermined voltage Vs(+) is applied to the transparent electrode 200 to deplete the − region 202 throughout it so that carriers may travel therein at a saturated velocity, electron-hole pairs are generated in the p− region 202 in the vicinity of the n+ region 201. The electrons thus created are absorbed into the n+ region 201 but the holes are accelerated by an electric field and accumulated in the p+ region 203 to charge it positive. As a result of this, the barrier potential for the n+ region 204 for electrons drops, permitting electrons to flow out of the n+ region 204 into the substrate across the p+ region 203 and the junction formed between the both regions held in the floating state. Thus, the n+ region 204 is biased positive.

The potential V(t) of the n+ region 204 is approximately given by the following expression relative to the light integration period of 0 to t sec:

$$V(t) = \frac{cq}{Cf} \int_0^t S(t)dt \quad (1)$$

where (S)t is the photon density, c is the velocity of light and q is the unit quantity of positive charges. Hence a voltage corresponding to the optical input is obtained.

Turning ON the readout transistor $Q_1$ through the word line 211, the potential on the bit line 210 varies with the voltage of the n+ region 204, so that the information of the picture element can be read out by detecting the voltage variation on the bit line. In this case, since the n+ region 204 and the p+ region 203 are both held in the floating state, the diffusion potential of the junction therebetween becomes equivalently low and, consequently, electrons having flowed into the n+ region 204 during the readout operation flow out therefrom towards the substrate across the p+ region 203. Accordingly, even after the readout transistor $Q_1$ is turned ON to read out the stored content, holes of optical information accumulated in the p+ region 203 can be retained, thus enabling non-destructive readout.

As will be seen from the expression (1), the potential of the n+ region 204 assumes a value which is proportional to the integration of the photon density of the optical input with respect to time. Accordingly, taking into account this and the non-destructive readout property of the image sensor cell, it can be understood that the potential V(t) of the n+ region 204 remains proportional to the value of integration of the photon density of the optical input with respect to time even after the non-destructive readout operation. In other words, even if the image information is once read out, the amount of integration of the optical input from the start of storage can be read out again.

The potential of the n+ region 204 does not approximately depend on its capacitance but ultimately depends on the integrated value of the optical input, so that the potential of the n+ region 204 can be read out substantially as it is. Consequently, exposure control can be effected more accurately.

In the image sensor cell of such an arrangement as described above, only when the hook-structured light detecting portion is exposed to light and an electric field of a magnitude larger than a certain value, either electrons or holes of electron-hole pairs created in the light detecting portion can be stored in the drain region of the readout transistor. For example, by applying a predetermined electric field to the light detecting portion for only a fixed period time while irradiating it by light, it is possible to obtain an image signal corresponding to that specified period of time. That is to say, what is called non-mechanical shutter function can be provided. However, in the case of carrying out the nondestructive readout after exposure, it is desirable to apply an electric field of such a value that holes generated in the high resistivity layer 202 during the readout operation do not reach the p+ region and that electrons having flowed into the high resistivity layer 202 across the p+ region 203 from the n+ region 204 are directed to the substrate. (A voltage for applying this electric field will hereinafter be referred to as the readout voltage.)

The erasing transistor $Q_2$ in FIGS. 2 and 3 is held in the OFF state during exposure and readout operation and, after the readout operation, it is turned ON to erase the holes stored in the p+ region 203 in preparation for the next exposure. The charges stored in the p+ region 203 can be removed not only the abovesaid method but also by inverting the substrate biasing voltage slightly negative or applying a high voltage to the gate electrode 214 to supply a large quantity of electrons from the bit line 210. Accordingly, it is also possible to adopt such an arrangement that omits the erasing transistor.

More detailed arrangements and modified forms of such a non-destructive readout type image sensor cell usable in the present invention are disclosed, for example, in our prior U.S. Pat. applications Ser. Nos. 254,046, 256,383 and Japanese patent application No. 60316/1980.

Figure 4:
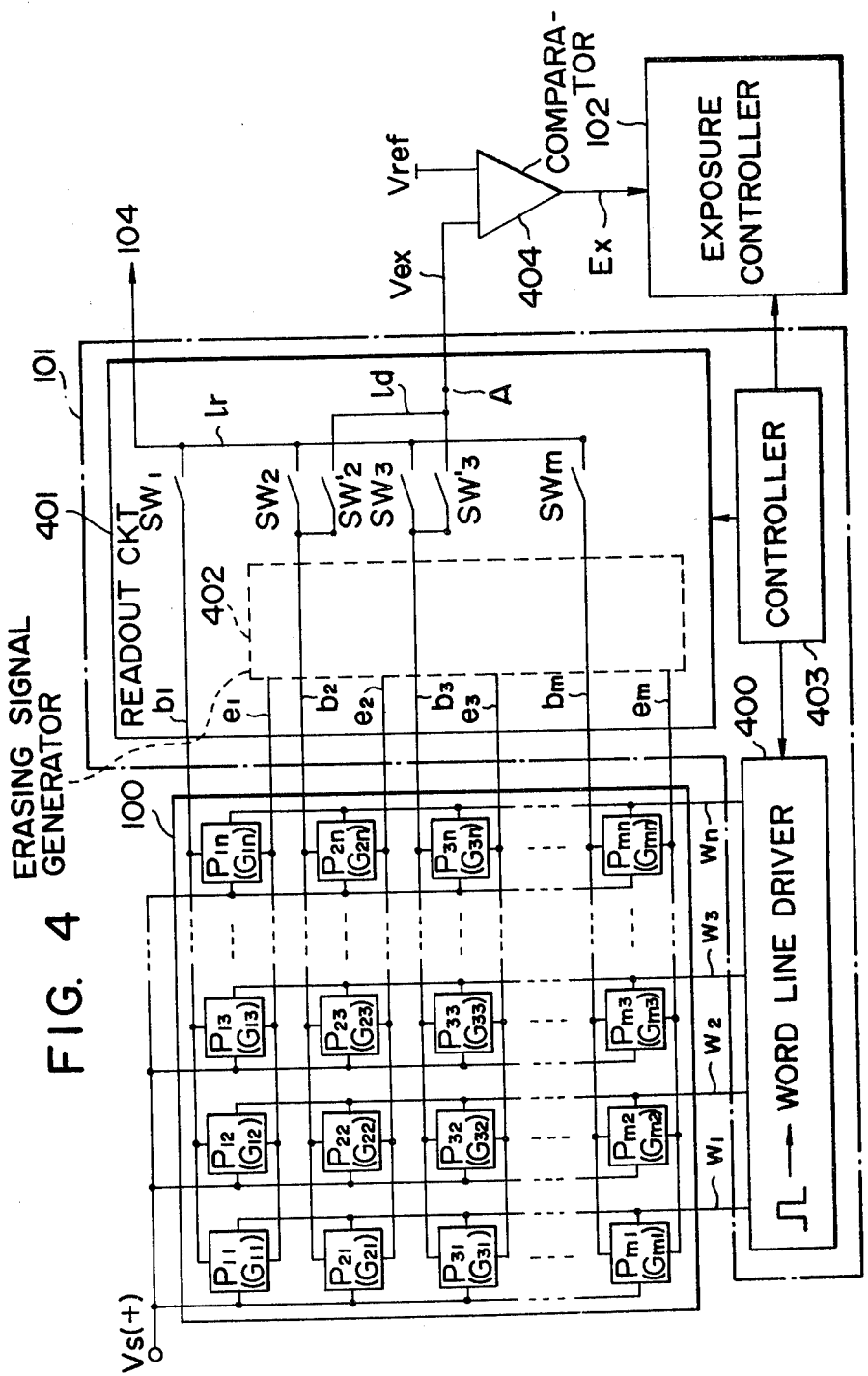
FIG. 4 is a block diagram illustrating the principal part of an embodiment of the present invention.

FIG. 4 illustrates in block form the principal part of an embodiment of the present invention which employs the photoelectric converter 100 using the image sensor cell of FIG. 2 as a basic picture element. In FIG. 4, the parts corresponding to those in FIGS. 1, 2 and 3 are identified by the same reference numerals and characters. Reference numeral 400 indicates a word line driver; $w_1$ to $w_n$ designate word lines; 401 identifies a readout circuit; 402 denotes an erasing signal generator, $b_1$ to $b_m$ represent bit lines; $e_1$ to $e_m$ show erase lines; 403 refers to a controller; $SW_1$ to $SW_m$ indicate main analog switches such as MOSFETs; $SW'_2$ and $SW'_3$ designate sub analog switches such as MOSFETs; lr identifies a video signal readout line ld denotes an exposure readout line; 404 represents a comparator Vref is an exposure reference voltage; Vex refers to a detected exposure voltage; and EX indicates an exposure control signal. The erasing signal generator 402 is to erase each image information by sending out an erasing signal on each of the erase line $e_1$ to $e_m$ and the controller 403 is to generate various control signals for the image sensor including the word line driver 400, the readout circuit 401 and the exposure controller.

The word line driver 400 applies pulse voltages to the word lines $w_1$ to $w_n$ at predetermined timing to sequentially select vertical picture element trains shown in FIG. 5. Stored information of the image sensor cells thus selected are provided on the bit lines $b_1$ to $b_m$ connected thereto. In the readout circuit 401, the bit lines $b_1$ to $b_m$ are respectively connected with the main analog switches $SW_1$ to $SW_m$, which are, in turn, connected with the video signal readout line lr. Accordingly, it is possible to read out stored information of a desired image sensor cell by the word line driver 400 and the main analog switches $SW_1$ to $SW_m$. By their operation the image sensor cells are scanned to read out their stored information. In this case, it is also possible to adopt such an arrangement in which pluralities of main analog switches and video signal readout lines are connected to each of the above bit lines and the scanning is performed in such a manner that stored information of each image sensor cell is read out together with stored information of other image sensor cells bearing predetermined positional relationship to the image sensor cell desired to read out, whereby the signal read out is subjected to image processing for improvement of its image quality.

The bit lines $b_2$ and $b_3$ are further connected with the sub analog switches $SW'_2$ and $SW'_3$, respectively, in addition to the main analog switches $SW_2$ and $SW_3$. The other ends of the sub analog switches $SW'_2$ and $SW'_3$ are connected to the exposure readout line ld. Now, let it be assumed, for example, that the word lines $w_2$ and $w_3$ are simultaneously selected in the case where only the sub analog switches $SW'_2$ and $SW'_3$ are in the ON state and the main analog switches $SW_1$ to $SW_m$ are all in the OFF state. Letting stored information of the image sensor cells $P_{11}$ to $P_{mn}$ be represented by $G_{11}$ to $G_{mn}$, there is provided on the exposure readout line ld an added value $G_{22}+G_{23}+G_{32}+G_{33}$ of the stored information of the image sensor cells $P_{22}$, $P_{23}$, $P_{32}$ and $P_{33}$. (The image sensor cells thus selected will hereinafter be referred to as exposure detecting image sensor cells.) This added value is proportional to the actual exposure of the exposure detecting image sensor cells; in other words, it is a mean added value of the actual exposure of the exposure detecting image sensor cells. By comparing this added value, that is, the detected exposure voltage Vex with the exposure reference voltage Vref in the comparator 404, the exposure state of the exposure detecting image sensor cells can be detected, which represents the exposure state of the entire image plane.

Figure 5A:
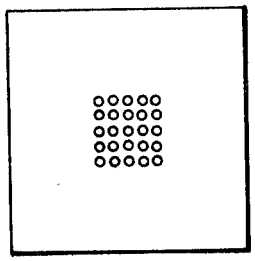
FIGS. 5A, 5B, 5C and 5D are schematic diagrams showing examples of the arrangement of exposure detecting image sensor cells on a photoelectric converter.
Figure 5B:
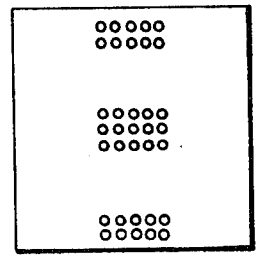

FIGS. 5A to 5D schematically show, by way of example patterns of exposure detecting image sensor cell arrays on the image plane. In FIG. 5A, a plurality of image sensor cells at the center of the image plane are used as the exposure detecting image sensor cells to attach weight to the center of the image plane in exposure detection. In FIG. 5B, the exposure is detected attaching weight to the upper and lower portions of the image plane in addition to the center thereof. In this case, the difference in weight between the center of the image plane and the upper and lower portions thereof is dependent on the ratio between the numbers of exposure detecting image sensor cells at the center of the image plane and the upper and lower portions thereof.

Figure 5C:
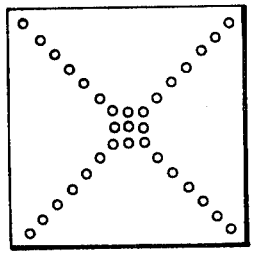
Figure 5D:
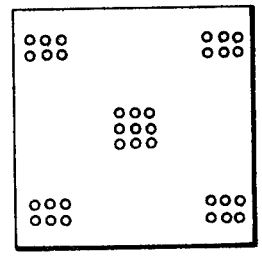
Figure 6:
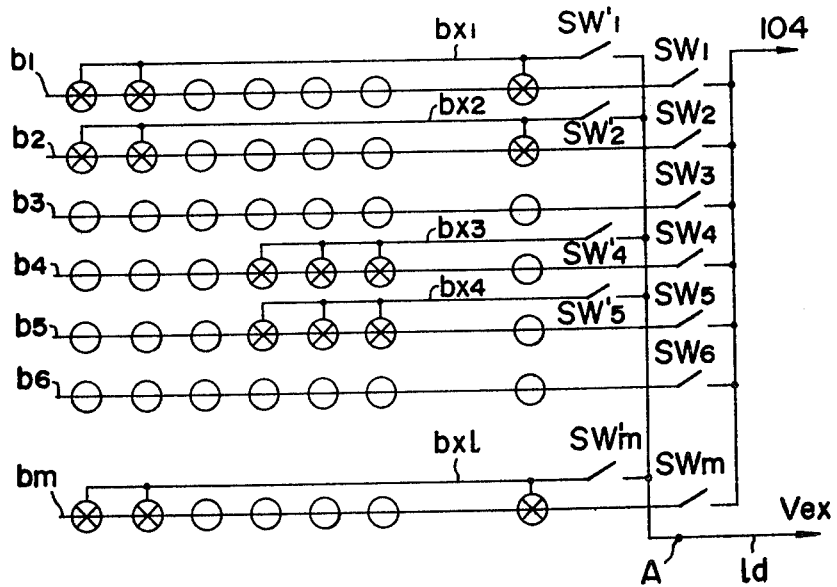
FIG. 6 is a block diagram illustrating the principal part of another embodiment of the present invention.

FIGS. 5C and 5D both show the exposure detection attaching weight to the center of the image plane and four corners thereof. In the case of obtaining such patterns as shown in FIGS. 5C and 5D through the use of the scanning method described previously in respect of FIG. 4, it is necessary to employ an arrangement such, for example, as shown in FIG. 6 in which bit lines $b_{x1}$ to $b_{xl}$ are provided for the exposure detecting image sensor cells indicated by crosses in circles ⊗ separately of the bit lines $b_1$ to $b_m$ connected to the main analog switches $SW_1$ to $SW_m$ and sub analog switches $SW_1'$ to $SW_m'$ are connected to the bit lines $b_{x1}$ to $b_{xl}$. In the case of weighting the image plane by dividing the image sensor cells connected to the same word line into one or more groups in the direction of the bit lines as depicted in FIGS. 5A and 5B, however, there is no need of providing such bit lines solely for exposure readout use.

For example, in FIG. 5B, by reading out the exposure detecting image sensor cells at the center of the image plane without attenuation and reading out the upper and lower exposure detecting image sensor cells with some attenuation (or multiplying by a coefficient), weighting of the exposure detection can be changed even in the case of the same pattern.

The detected signal EX derived from the comparator 404 is applied to the exposure controller 102, wherein predetermined exposure control is performed. The exposure control that can be used in the present invention is, for example, as follows:

(1) Control of exposure time

This is to control the charge storage time of the image sensor cells $P_{11}$ to $P_{mn}$ when the exposure is decided, to be optimum in the caparator 404. This can be achieved by a method of intercepting light incident on the image sensor cells through the use of an optical shutter means, or a method of decreasing the bias voltage Vs(+) of the image sensor cells down to the readout voltage to electronically stop the charge storage operation.

Figure 7:
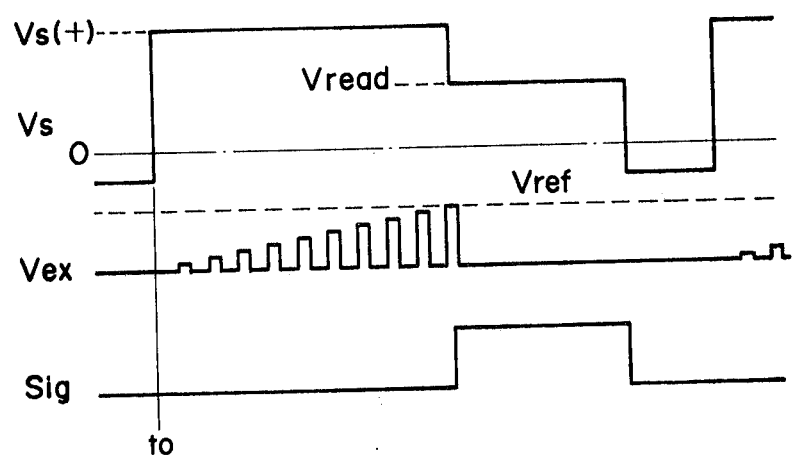
FIG. 7 is explanatory of the operation of the embodiment shown in FIG. 4.

FIG. 7 shows, by way of example, the operation of the device of FIG. 4 in the case of employing the latter method. At a moment $t_0$, the bias voltage Vs is raised from a negative potential up to the charge storage voltage Vs(+), starting the charge storage operation (corresponding to the opening of a shutter). The stored information of the exposure detecting image sensor cells is read out by the aforesaid method with a period sufficiently shorter than the exposure time. The detected exposure voltage Vex is compared by the comparator 404 with the exposure reference value Vref and, for example, when the former Vex exceeds the latter Vref, the exposure control signal EX is provided to the exposure controller 102. When supplied with the exposure control signal EX, the exposure controller 102 reads out the bias voltage Vs and lowers it down to the readout voltage Vread, stopping the charge storage operation of the image sensor cells (corresponding to the closure of the shutter). After exposure the photoelectric converter 100 is scanned to provide a read-out signal sig and, after the readout operation, the bias voltage Vs is made slightly negative, thereby erasing the stored information.

(2) Control of the intensity of light incident on the image sensor cells

This is to accomplish optimum exposure by coupling the exposure control signal EX of the comparator 404 with a diaphragm mechanism of the image sensor.

(3) Control of the photosensitivity of the image sensor cells

This is to change the photosensitivity of the image sensor cells by controlling the bias voltage Vs (+) which is applied to them during exposure.

In the case of using the methods (2) and (3), it is desirable to select the exposure reference voltage Vref low so that the exposure control may be effected at a relatively early stage of the charge storage operation.

(4) Combination of the methods (1), (2) and (3)

By the combined use of the exposure time control and the incident light intensity control, for example, it is possible to obtain what is called a program shutter mechanism. Further, so-called 3-variable control can be achieved by controlling the charge storage time, the intensity of incident light and the photosensitivity of the image sensor cells.

Figure 8:
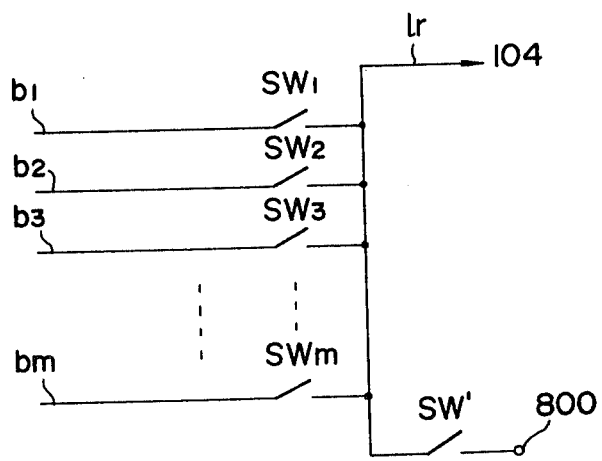
FIG. 8 is a block diagram illustrating the principal part of another embodiment of the present invention.

As described above, according to the device of this embodiment, exposure control is effected in accordance with the quantity of light incident on the image sensor cells, and hence it can be achieved with high accuracy. Although in FIGS. 4 and 6 the plurality of sub analog switches $SW_1'$ to $SW_m'$ are provided, it is also possible to connect one sub analog switch to the exposure readout line ld at a point A. Further, the main analog switches $SW_1$ to $SW_m$ can be used in common to the exposure detection and the video signal readout by the use of such an arrangement as shown in FIG. 8 in which a changeover switch SW' is connected to the video signal readout line lr and, during the exposure detection alone, it is turned ON to derive the detected exposure voltage Vex at a terminal 800. Moreover, in FIGS. 4 and 6, only one exposure readout line ld is provided but it is also possible to employ such an arrangement in which a plurality of such exposure readout lines are provided and information read out thereon is applied to an adder. Furthermore, if each image information is stored, for example, in a capacitor, the sub analog switches $SW_1'$ to $SW_m'$ need not necessarily be turned ON at the same timing.

Figure 9:
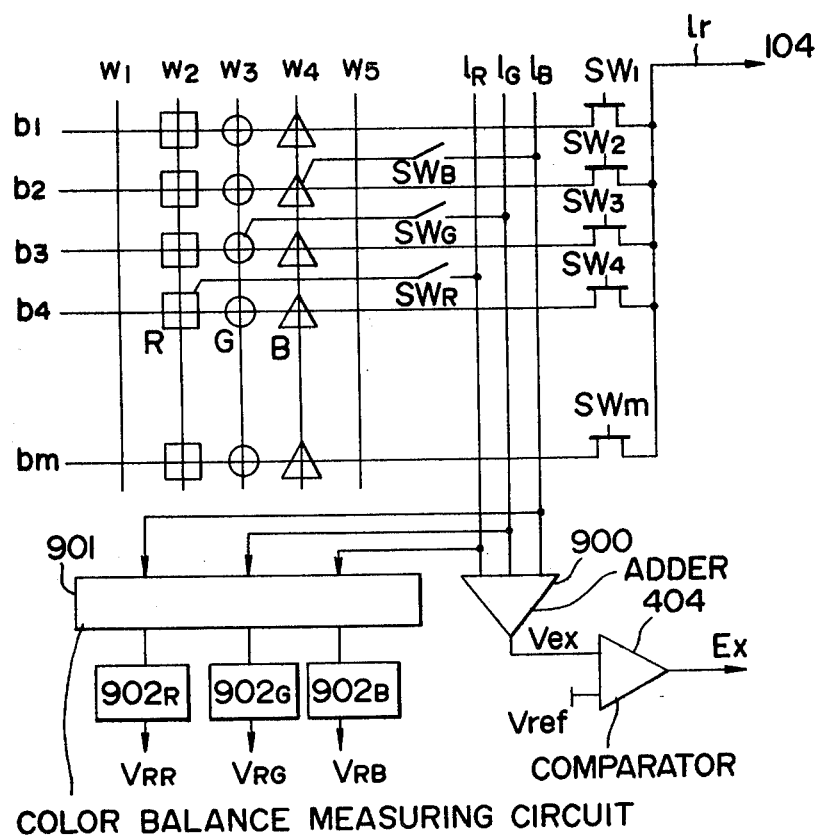
FIG. 9 is a block diagram illustrating the principal part of still another embodiment of the present invention as being applied to a color image sensor.

FIG. 9 illustrates in block form the principal part of another embodiment of the present invention as being applied to a color image sensor. In FIG. 9, the parts corresponding to those in FIG. 4 are identified by the same reference numerals and characters. The image sensor cells identified by squares, circles and triangles are respectively red (R), green (G) and blue (B) image sensor cells determined, for instance, by a multi-color micro-color filter. Reference characters $l_r$, $l_G$ and $l_B$ designate sub analog switches for exposure detection use; 900 identifies an adder; 901 denotes a color balance measuring circuit; $902_R$, $902_G$ and $902_B$ represent readout voltage determining circuits; and $R_{RR}$, $V_{RG}$ and $V_{RB}$ show readout gate voltages.

Pluralities of predetermined ones of the image sensor cells corresponding to red, green and blue are selected for red exposure detection, for green exposure detection and for blue exposure detection. Their exposure values are taken out on the exposure readout lines $l_R$, $l_G$ and $l_B$ independently provided corresponding to the red, green and blue image sensor cells, respectively. The adder 900 adds together the voltages thus provided on the exposure readout lines $l_R$, $l_G$ and $l_B$ and applies the added value as the detected exposure voltage Vex to the comparator 404, by the output of which is performed the same exposure control as in the above-described embodiment.

The voltages on the exposure readout lines $l_R$, $l_G$ and $l_B$ are also provided to the color balance measuring circuit 901, wherein the voltage levels of red, green and blue are compared and an operation for obtaining color balance is conducted. In accordance with the result of this operation, the readout gate voltages $V_{RR}$, $V_{RG}$ and $V_{RB}$ corresponding to red, green and blue, respectively, are determined by the readout voltage determining circuits $902_R$, $902_G$ and $902_B$. By the readout gate voltages $V_{RR}$, $V_{RG}$ and $V_{RB}$ thus obtained, the main analog switches $SW_1$ to $SW_m$ are driven and, by changing the gate voltages, there is produced a video signal having its color balance corrected.

Instead of changing the gate pulse voltages to change the signals to be read out, it is also possible to employ such an arrangement in which the signals obtained by the operation for color balance are applied to another arithmetic unit to perform the readout signals, thereby adjusting the color balance. Also it is possible to weight the exposure detection for each color by changing a coefficient or the number of image sensor cells to be read out for each color when to read out stored information of each image sensor cell.

As has been described in the foregoing, according to the present invention, the photoelectric converter or optoelectro transducer unit is formed by the non-destructive readout type image sensor cells. During exposure, stored information of a plurality of predetermined image sensor cells is read out and, upon detection of their added value having reached a predetermined value, predetermined exposure control is performed. The exposure is controlled in accordance with the quantity of light incident on the image sensor cells themselves; hence, accurate exposure control can be achieved. Accordingly, the present invention is of great utility when employed in a two-dimensional solid-state image sensor and the like.

It will be apparent that many modifications and variations may be effected without departing from the scope of the novel concepts of the present invention.

What is claimed is:

1. A two-dimensional solid-state image sensor comprising:

a photoelectric converter having a plurality of non-destructive readout type image sensor cells arranged in a predetermined form for exposure to a light pattern and for storing a charge in at least some of said cells related to the light pattern to form stored information which is not destroyed by reading out the stored information;

an exposure detector connected to the photoelectric converter for reading out the stored information of a plurality of predetermined ones of the cells during the exposure, for obtaining an added value of the stored information thus read out and for detecting when the added value reaches a predetermined level to form a detected signal;

an exposure controller connected to the exposure detector for being supplied with the detected signal from the exposure detector to control at least one of; a charge storage time of each image sensor cell, the intensity of light incident on the image sensor cells and a photosensitivity of the image sensor cells, to terminate the building of charge in the cells; and a scanner connected to the photoelectric converter for scanning the photoelectric converter to read out the stored information of the image sensor cells after the building of charge has been terminated.

2. A two-dimensional solid-state image sensor according to claim 1, wherein the non-destructive readout type image sensor cells are photoelectric conversion elements, each having a hook structure made of a plurality of semi-conductor layers forming a transistor with an electrically floating base.

3. A two-dimensional solid-state image sensor according to claim 1, wherein the exposure detector and the scanner include a word line driver for sequentially selecting picture element trains, each consisting of a plurality of image sensor cells arranged in a column direction on the photoelectric converter; a plurality of bit lines each connected to a plurality of the cells for taking out the outputs from the cells of each picture element train selected by the word line driver; a plurality of main analog switches for connecting the bit lines to a video signal readout line; sub analog switches for connecting predetermined ones of the bit lines which are connected to the predetermined ones of the cells, to an exposure readout line; a controller for performing ON-OFF control of the sub analog switches and the main analog switches to read out stored information of the predetermined ones of the cells during exposure and to read out stored information of the cells after the building of charge has been terminated; and a comparator for comparing a voltage of the exposure readout line with an exposure reference voltage to produce an exposure detected signal.

4. A two-dimensional solid-state image sensor according to claim 3 wherein the sub analog switches are connected to those of the bit lines connected to the image sensor cells disposed centrally of the photoelectric converter, and the word line driver selects the centrally disposed image sensor cells in the column direction during exposure detection.

5. A two-dimensional solid-state image sensor according to claim 3 wherein the sub analog switches are connected to those of the bit lines connected to the image sensor cells disposed at the central and a peripheral portion of the photoelectric converter, and the word line driver selects the centrally disposed image sensor cells in the column direction during exposure detection.

* * * * *